United States Patent
Massire et al.

(10) Patent No.: US 10,151,816 B2
(45) Date of Patent: Dec. 11, 2018

(54) METHOD OF DESIGNING AND GENERATING PULSES FOR MAGNETIC RESONANCE IMAGING

(71) Applicant: COMMISSARIAT A L'ENERGIE ATOMIQUE ET AUX ENERGIES ALTERNATIVES, Paris (FR)

(72) Inventors: Aurélien Massire, Vouvray (FR); Nicolas Boulant, Saint Aubin (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 82 days.

(21) Appl. No.: 15/126,222

(22) PCT Filed: Apr. 16, 2015

(86) PCT No.: PCT/EP2015/058253
§ 371 (c)(1),
(2) Date: Sep. 14, 2016

(87) PCT Pub. No.: WO2015/158814
PCT Pub. Date: Oct. 22, 2015

(65) Prior Publication Data
US 2017/0082714 A1    Mar. 23, 2017

(30) Foreign Application Priority Data
Apr. 17, 2014    (EP) .................................. 14165238

(51) Int. Cl.
G01V 3/00    (2006.01)
G01R 33/561    (2006.01)
(Continued)

(52) U.S. Cl.
CPC ..... *G01R 33/5617* (2013.01); *G01R 33/4616* (2013.01); *G01R 33/4836* (2013.01); *G01R 33/5612* (2013.01)

(58) Field of Classification Search
CPC .................................................. G01R 33/5617
(Continued)

(56) References Cited

U.S. PATENT DOCUMENTS

| 8,866,478 B2 * | 10/2014 | Adalsteinsson .. G01R 33/56563 |
| | | 324/309 |
| 2015/0323635 A1 * | 11/2015 | Haacke .............. G01R 33/5616 |
| | | 324/309 |
| 2017/0212197 A1 * | 7/2017 | Li ...................... G01R 33/5617 |

FOREIGN PATENT DOCUMENTS

WO    2011/098713 A1    8/2011

OTHER PUBLICATIONS

J. Hennig et al., "RARE imaging: a fast imaging method for clinical MR," Magnetic Resonance in Medicine, vol. 3, 1986, pp. 823-833.
(Continued)

*Primary Examiner* — Louis Arana
(74) *Attorney, Agent, or Firm* — Baker & Hostetler LLP

(57) ABSTRACT

A method of designing a refocusing pulse or pulse train for Magnetic Resonance Imaging comprises the steps of: a) determining a phase-free performance criterion representative of a proximity between a rotation of nuclear spins induced by the pulse and a target operator, summed or averaged over one or more voxels of an imaging region of interest; and b) adjusting a plurality of control parameters of the pulse to maximize the phase-free performance criterion; wherein each target operator is chosen so the phase-free performance criterion takes a maximum value when the nuclear spins within all voxels undergo a rotation of a same angle θ around a rotation axis lying in a plane perpendicular to a magnetization field $B_0$, called a transverse plane, with (Continued)

an arbitrary orientation; wherein the angle θ is different from Mπ radians, with integer M, preferably with θ<π radians and even preferably with θ≤0.9·π radians.

26 Claims, 4 Drawing Sheets

(51) Int. Cl.
  *G01R 33/46* (2006.01)
  *G01R 33/483* (2006.01)
(58) Field of Classification Search
  USPC .................................. 324/314, 306, 307, 309
  See application file for complete search history.

(56) References Cited

OTHER PUBLICATIONS

M. A. Cloos et al., "kT-Points: short three-dimensional tailored RF pulses for flip-angle homogenization over an extended volume," Magnetic Resonance in Medicine, vol. 67, (2012), pp. 72-80.
M. A. Cloos et al., "Parallel-transmission-enabled magnetization-prepared rapid gradient-echo T1-weighted imaging of the human brain at 7 T," NeuroImage, vol. 62 (2012), pp. 2140-2150.
J. Pauly et al., "A linear class of large-tip-angle selective excitation pulses," Journal of Magnetic Resonance, vol. 82 (1989), pp. 571-587.
A. Massire et al., "Design of non-selective refocusing pulses with phase-free rotation axis by gradient ascent pulse engineering algorithm in parallel transmission at 7 T," Journal of Magnetic Resonance, vol. 230, 2013, pp. 76-83.
J. Pauly et al., "Parameter relations for the Shinnar-Le Roux selective excitation pulse design algorithm," IEEE Transactions on Medical Imaging, vol. 10, No. 1, Mar. 1991, pp. 53-64.
M. A. Janich et al., "Robust slice-selective broadband refocusing pulses," Journal of Magnetic Resonance, vol. 213, No. 1, 2011, pp. 126-135, XP028331595.
Wolter de Graaf et al., "Lesion detection at seven Tesla in multiple sclerosis using magnetization prepared 3D-FLAIR and 3D-DIR," Magnetic Resonance, Eur Radiol 2012, vol. 22, pp. 221-231.
Anja van der Kolk et al., "Intracranial Vessel Wall Imaging at 7.0-T MRI," Stroke 2011, vol. 42, pp. 2478-2484.
J. Hennig et al., "Hyperechoes," Magnetic Resonance in Medicine, 2001, vol. 46, pp. 6-12.
Reed Busse et al., "Fast Spin Echo sequences with very long echo trains: Design of variable refocusing flip angle schedules and generation of clinical T2 contrast," Magnetic Resonance in Medicine, 2006, vol. 55, pp. 1030-1037.
JP Mugler et al., "Three-dimensional T2-weighted imaging of the brain using very long spin-echo trains," In Proceedings of the 8th Annual Meeting of ISMRM, Denver, Colorado, USA, 2000, pp. 687.
Fredy Visser et al., "High-resolution magnetization-prepared 3D-FLAIR imaging at 7.0 Tesla," Magnetic Resonance in Medicine, 2010, vol. 64, pp. 194-202.
Ulrich Katscher et al., "Transmit SENSE," Magnetic Resonance in Medicine, vol. 49, 2003, pp. 144-150.
Y. Zhu, "Parallel excitation with an array of transmit coils," Magnetic Resonance in Medicine, vol. 51, 2004, pp. 775-784.
P.F. Van de Moortele et al., "B1 Destructive Interferences and Spatial Phase Patterns at 7 T with a Head Transceiver Array Coil," Magnetic Resonance in Medicine, vol. 54, 2005, pp. 1503-1518.
Shaihan Malik et al., "Spatially resolved extended phase graphs: modeling and design of multipulse sequences with parallel transmission," Magnetic Resonance in Medicine, 2012, vol. 68, pp. 1481-1494.
D. Xu et al., "Designing multichannel multidimensional, arbitrary flip angle RF pulses using an optimal control approach," Magnetic Resonance in Medicine, vol. 59, 2008, pp. 547-560.
Kawin Setsompop et al., High-flip-angle slice-selective parallel RF transmission with 8 channels at 7 Tesla,: Journal Magnetic Resonance, 2008, vol. 195, pp. 76-84.
Florent Eggenschwiler et al., "Improving T2-weighted imaging at High Field through the use of kT-points," Magnetic Resonance in Medicine, 2014, vol. 71, pp. 1478-1488.
N. Khaneja et al., "Optimal control of coupled spin dynamics: design of NMR pulse sequences by gradient ascent algorithms," Journal Magnetic Resonance, 2005, vol. 172, pp. 296-305.
K. Setsompop et al., "Magnitude least squares optimization for parallel radio frequency excitation design demonstrated at 7 Tesla with eight channels," Magnetic Resonance in Medicine, 2008, vol. 59, pp. 908-915.

* cited by examiner

METHOD OF DESIGNING AND GENERATING PULSES FOR MAGNETIC RESONANCE IMAGING

CROSS-REFERENCE TO RELATED APPLICATIONS

This application is a National Stage of International patent application PCT/EP2015/058253, filed on Apr. 16, 2015, which claims priority to foreign European patent application No. EP 14165238.8, filed on Apr. 17, 2014, the disclosures of which are incorporated by reference in their entirety.

FIELD OF THE INVENTION

The invention relates to a computer-implemented method for designing a refocusing pulse or pulse train, or a pulse sequence, for Magnetic Resonance Imaging (MRI) and to a computer program product for carrying out such a method. The invention also relates to a method of generating such a pulse, pulse train or pulse sequence, to a method of performing Magnetic Resonance Imaging and to a MRI apparatus.

BACKGROUND

Within the present application:
"Pulse" will designate a radio-frequency (RF) pulse at the Larmor frequency, which can be either simple (e.g. square) or "composite", comprising a succession of simple pulses, called sub-pulses or elementary pulses, and, possibly gradient blips. A pulse is designed to induce a predetermined rotation of nuclear spins. It can be characterized by a complex envelope modulating a radio-frequency carrier at the Larmor frequency.
"Pulse train" will designate a succession of pulses, either simple or composite, each inducing a respective rotation of nuclear spins.
"Refocusing pulse/pulse train" will designate a pulse/pulse train designed to refocus nuclear spin in the transverse plane (i.e. in a plane perpendicular to the magnetization, or longitudinal, magnetic field $B_0$).
"Inversion pulse" will designate a pulse, either simple or composite, designed for rotating nuclear spins by 180°, or $\pi$ radians. An inversion pulse can be used for refocusing.
"Excitation pulse" will designate a pulse, either simple or composite, designed for flipping nuclear spins initially aligned along the direction of $B_0$.
"Pulse sequence" or simply "sequence" will designate a full MRI sequence comprising at least an excitation pulse and possibly inversion and/or refocusing pulse(s).
"$B_1$" will designate the radio-frequency field at the Larmor frequency associated to pulses. $B_1$ can be written as the sum of two counter-rotating circularly-polarized fields: $B_1^+$, rotating in the same direction as the nuclear spins, and $B_1^-$, rotating in the opposite direction. Only $B_1^+$ contributes to rotating and flipping spins.

The invention applies in particular, albeit not exclusively, to $T_2$-weighted imaging, more particularly when performed at Ultra-High magnetic Field (e.g. 7 Tesla and above), when $B_0$ and $B_1$ non-uniformities become a major concern. The inventive method can be applied to the design and generation of known sequences based on turbo-spin echo and combined with known techniques such as $k_T$-points and/or parallel-transmission MRI.

$T_2$-weighted imaging is a fundamental MRI technique for the diagnosis of brain diseases or injuries involving gray matter and white matter lesions such as strokes, ischemia and multiple sclerosis [1,2]. $T_2$-weighted imaging is commonly achieved thanks to the spin-echo phenomenon, which consists in reversing the dephasing of the transverse magnetization to create a signal echo. RARE imaging [3] (also known as Turbo Spin Echo or Fast Spin Echo) increases the speed of spin-echo imaging by acquiring a series of spin echoes with different phase encodings after each excitation. Later developments on RARE were aimed at reducing and continuously varying the flip angle of the refocusing pulses as a useful means of addressing high radiofrequency (RF) power deposition and typical RARE image artifacts such as blurring [4,5]. The variable flip angle turbo spin echo sequence, referred to as "SPACE" (Sampling Perfection with Application optimized Contrasts using different flip angle Evolution) [6], is now among the most commonly employed 3D sequences to obtain $T_2$-weighted anatomical images of the brain. To this end, an excitation pulse is followed by a long variable angle refocusing pulse train acquiring an entire k-space partition plane per repetition (TR). Careful adjustment of the targeted angles and the echo spacing between the acquisition blocks, as well as the usual imaging parameters, allows excellent contrast between gray matter (GM), white matter (WM) and Cerebrospinal fluid (CSF) at field strengths up to 3 Tesla [5].

$T_2$-weighted imaging should benefit from the increased signal-to-noise ratio available at high field strengths (7 Tesla and beyond) to enable higher spatial resolution acquisitions and hence better visualization of small structures and fluid interfaces of the brain. However, as mentioned above, when moving towards Ultra High Fields (UHF), the increased resonance frequency of proton nuclei (297 MHz at 7 Tesla) causes the RF wavelength to become smaller than the human brain, leading to an inhomogeneous distribution of the transmit magnetic field ($B_1^+$). This spatial $B_1^+$ inhomogeneity gives rise not only to variations in signal intensity for a given tissue across the brain, but more importantly, to different levels of contrast in the same image [7]. Parallel transmission (pTX) [8,9] has been repeatedly shown to successfully mitigate these issues. This technique utilizes multiple independently-driven coil elements distributed around the subject. In its simplest form, referred to as RF-Shimming [10], the $B_1^+$ fields from all coil elements are combined optimizing the amplitude and phase of each array element, while keeping the waveforms identical, to optimize the $B_1^+$ distribution in a region of interest (ROI). RF-shimming has already demonstrated its ability to mitigate the $B_1^+$ field inhomogeneity at 3 T in the context of $T_2$-weighted imaging with a TSE sequence [11]. Further generalization of this concept led to the introduction of Transmit-SENSE, exploiting the full potential of the transmit-array by tailoring the RF waveforms to apply to each of the individual coil-elements. This transmission generally occurs in concert with magnetic field gradients to provide additional degrees of freedom in order to maximize the final excitation uniformity.

In that framework, whole-brain non-selective uniform spin excitations were demonstrated at 7 Tesla using a $k_T$-point trajectory [12]. This technique proposes a minimalistic transmit k-space trajectory concentrated around the center of k-space to compensate for the smooth RF inhomogeneities present in volumes such as the human brain. This method was then extended to large tip angles. Using optimal control theory [13] and when applied to MP-RAGE $T_1$-weighted imaging, such pulses were shown to provide excellent spatial uniformity throughout the human brain [14]. On the other hand, when dealing with refocusing properties of RF pulses, most work carried out so far has exclusively been in 2D and has relied on a state description of the dynamics and on the, not always fulfilled, linear class of large tip angle (LCLTA) criteria [15] to presume consistent behavior for arbitrary states [16]. The non-selective refocusing pulses included in the 3D spin-echo (SE) and turbo-spin-echo (TSE) sequences, all relevant for $T_2$-weighted imaging at UHF have only seldom been addressed.

Reference [17] discloses a MRI method wherein self-refocused $k_T$-points pulses are placed in a SPACE sequence and provided $T_2$-weighted images of improved quality in terms of signal and contrast homogeneity. However in that study, only one RF pulse was designed and subsequently scaled for the whole RF echo train, an approximation that worsens with the angle value. A purely transverse rotation axis was also assumed by imposing self-refocused pulses [15], likewise an approximation that deteriorates at high flip angle values and when there are off-resonance effects.

Yet in the same time, further optimized non-selective phase-free refocusing $k_T$-points pulses able to mitigate severe $B_1^+$ and $\Delta B_0$ inhomogeneities have been investigated to achieve a 180° transverse rotation of the spins, regardless of the initial state of the magnetization at 7 Tesla with pTX [28], thanks to an adaptation of the GRadient Ascent Pulse Engineering algorithm (GRAPE) [18], originally developed for NMR-spectroscopy. The method of reference [19], however, is strictly limited to the case of a single pulse inducing a 180° transverse rotation about a free transverse rotation axis which is not sufficient for carrying out several advanced imaging techniques. Generalization to an arbitrary rotation angle and/or to a train of pulses inducing different rotations about a same axis is not straightforward.

SUMMARY OF THE INVENTION

The invention aims at overcoming the limitations of the prior art, and in particular those of reference [19] by providing a method of designing refocusing pulses and/or pulse trains inducing rotations of angles different from—and in particular smaller than −180° (or π radians), while mitigating the effect of the RF-field (and magnetization field) inhomogeneities.

According to the present invention, this aim is achieved by adapting the GRAPE algorithm to the problem of designing refocusing pulses/pulse trains with specific constraints, i.e. inducing a predetermined refocusing angle (other than 180°) and with either a specific phase distribution or a free phase ("phase" meaning the orientation of the rotation axis in the transverse plane).

The invention will be described with reference to the case of $T_2$-weighting imaging with pTx and at UHF, but it can be applied more broadly to any MRI technique using refocusing.

An object of the present invention is a method of designing a refocusing pulse for Magnetic Resonance Imaging, comprising the steps of:

a) determining a performance criterion, called phase-free performance criterion, representative of a proximity between a rotation of nuclear spins induced by said pulse and at least one target operator, summed or averaged over one or more voxels of an imaging region of interest; and b) adjusting a plurality of control parameters of said pulse to maximize said phase-free performance criterion;

wherein said or each said target operator is chosen such that said phase-free performance criterion takes a maximum value when the nuclear spins within all said voxels undergo a rotation of a same angle θ around a rotation axis lying in a plane perpendicular to a magnetization field $B_0$, called a transverse plane, with an arbitrary orientation, and wherein at least said step b) is carried out by computer;

characterized in that said angle θ is different from Mπ radians, with integer M, preferably with θ<π radians and even preferably with θ≤0.9·π radians.

Another object of the invention is a method of designing a refocusing pulse train for Magnetic Resonance Imaging, said pulse train comprising a plurality of refocusing pulses, each of said refocusing pulses being adapted for inducing a rotation of nuclear spins of a respective angle $\theta_i$, said method comprising the steps of:

A. applying a method according to any of the preceding claims for designing one said refocusing pulse, called reference pulse;

B. for one or more voxels of said imaging region of interest, determining a voxel-dependent nuclear spin rotation axis, expressed by vector $n_T=(n_{xT}, n_{yT}, n_{zT}=0)$ in a Cartesian frame having a z-axis parallel to said magnetization field $B_0$, corresponding to said reference pulse;

C. for each of said refocusing pulses, other than said reference pulse, determining a performance criterion, called phase-constrained performance criterion, representative of a proximity between a rotation of nuclear spins induced by said pulse and a target operator, summed or averaged over said voxels of an imaging region of interest; and adjusting a plurality of control parameters of said pulse to maximize said phase-constrained performance criterion;

wherein, for each of said refocusing pulses other than said reference pulse, identified by an index i, said target operator is chosen such that said phase-constrained performance criterion takes a maximum value when the nuclear spins within each of said voxels undergo a rotation of a same angle $\theta_i$ around a respective nuclear spin rotation axis $n_T$ determined at step B.

Yet another object of the invention is a method of designing a Magnetic Resonance Imaging pulse sequence, comprising:

designing a refocusing pulse or pulse train by applying a method according to any of the preceding claims;

designing a nuclear spin excitation pulse, to be generated before said refocusing pulse or pulse train, by: determining a performance criterion, called phase-constrained performance criterion, representative of a proximity between a rotation of nuclear spins induced by said excitation pulse and a target operator, summed or averaged over said voxels of an imaging region of interest; and adjusting a plurality of control parameters of said pulses to maximize said phase-constrained performance criterion;

wherein, for each of said refocusing pulses other than said reference pulse, identified by an index i, said target operator is chosen such that said phase-constrained performance criterion takes a maximum value when the nuclear spins within each of said voxels undergo a rotation of a same flipping angle FA around a respective nuclear spin rotation axis lying in said transverse plain and orthogonal to the nuclear spin rotation axis corresponding to said refocusing pulse or pulse train.

Yet another object of the invention is a method of generating a Magnetic Resonance Imaging pulse, pulse train or pulse sequence comprising:

a step of designing said pulse, pulse train or pulse sequence by applying such a method; and a step of actually generating said pulse, pulse train or pulse sequence.

A further object of the invention is a method of performing Magnetic Resonance Imaging comprising a step of generating a pulse, pulse train or pulse sequence using said method.

Another object of the invention is a computer program product comprising a set of instruction suitable for carrying out such a method when executed on a computer.

An additional object of the invention is a Magnetic Resonance Imaging apparatus comprising at least a magnet for generating a magnetization field, a set of gradient coils for generating magnetic field gradients, at least one radio-frequency coil for transmitting and/or receiving radio-frequency pulses, at least a radio-frequency emitter and a radio-frequency receiver connected to said radio-frequency coil or coils and a data processor configured for driving at least said radio-frequency emitter or emitters, characterized in that said data processor is configured or programmed to carry out such a method.

Particular embodiments of the invention constitute the subject-matter of the dependent claims.

Documents [18] and [19] are incorporated by reference.

BRIEF DESCRIPTION OF THE DRAWINGS

Additional features and advantages of the present invention will become apparent from the subsequent description, taken in conjunction with the accompanying drawings, which show.

DETAILED DESCRIPTION

Figure 1:
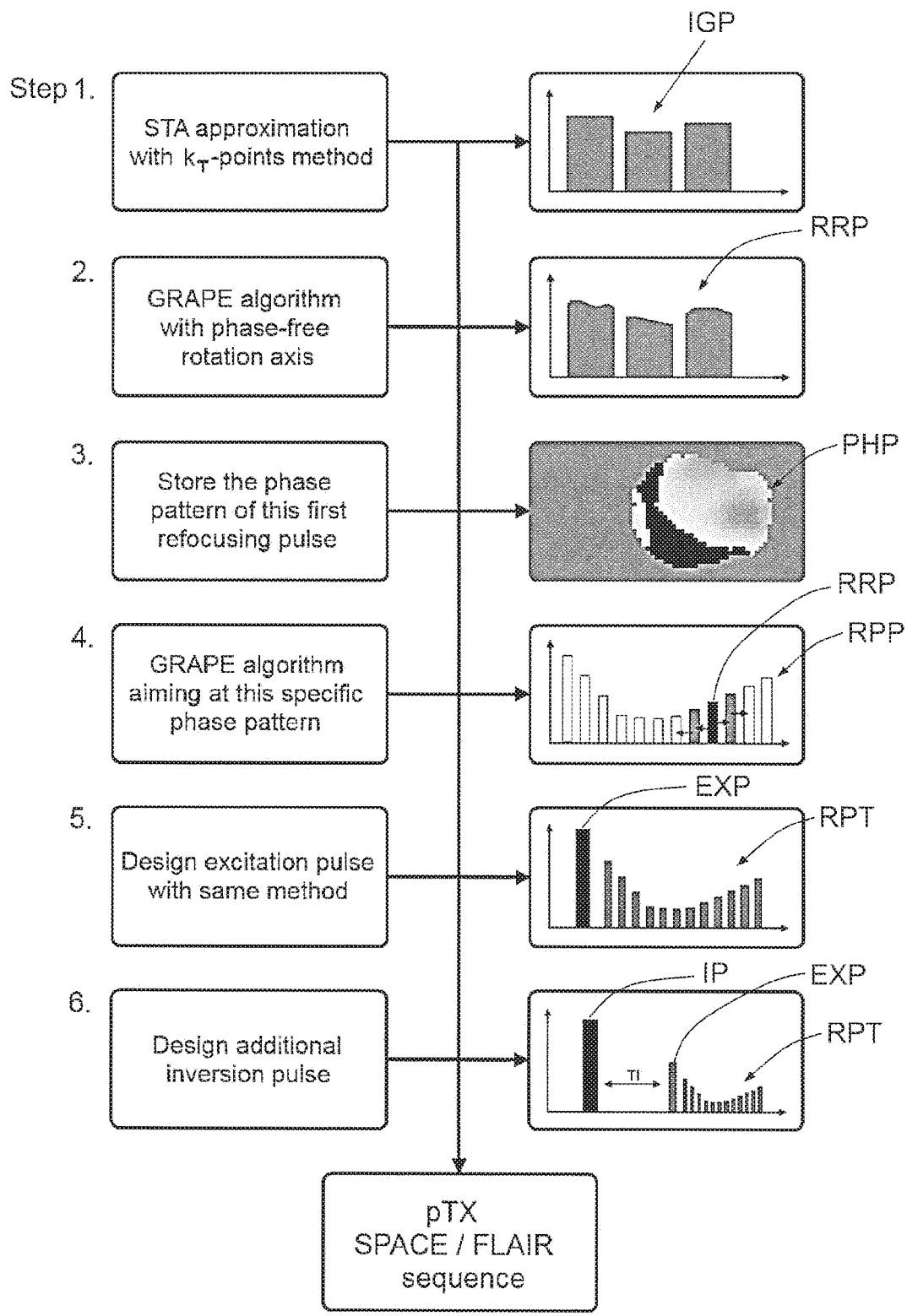
FIG. 1, the flow-chart of a method according to a particular embodiment of the invention.

The GRAPE method applied to the design of a refocusing pulse will now be described using the SU(2) group formalism. If relaxation effects are neglected, the Bloch dynamics of the magnetization is simply expressed by a 2×2 unitary matrix, the so-called spin-domain representation. In this domain, a rotation of the nuclear spins within the $n^{th}$ voxel of a MRI region of interest by an angle $\Phi$ about a vector n $(n_x, n_y, n_z)$ can be described by the complex-valued Cayley-Klein parameters $(\alpha, \beta)$ [20]

$$U_n(T) = \begin{bmatrix} \alpha & -\beta^* \\ \beta & \alpha^* \end{bmatrix} \quad (1)$$

with $|\alpha|^2+|\beta|^2=1$ and, in the specific case of a vector n lying in the transverse plane (xy plane $\perp B_0$)

$$\begin{cases} \alpha = \cos\frac{\Phi}{2} - in_z\sin\frac{\Phi}{2} \\ \beta = -i(n_x + in_y)\sin\frac{\Phi}{2} \end{cases} \quad (2)$$

For a given RF pulse $B_1(r, t)$, gradient waveform $G(t)$ and static magnetization field offset of $\Delta B_0$, the $\alpha$ and $\beta$ parameters representing the rotation they induce at a spatial location r are obtained by solving the spin-domain Bloch equation:

$$\begin{bmatrix} \dot\alpha \\ \dot\beta \end{bmatrix} = \frac{i\gamma}{2} \begin{bmatrix} G\cdot r + \Delta B_0 & B_1^* \\ B_1 & -(G\cdot r + \Delta B_0) \end{bmatrix} \begin{bmatrix} \alpha \\ \beta \end{bmatrix} \quad (3a)$$

Equation 3a can be solved exactly if the pulse is rectangular or, more generally, is decomposed into a sequence of elementary rectangular (constant amplitude and phase) sub-pulses $B_{1,j}$ of duration $\Delta t$, each inducing a spin rotation of an angle $\Phi_j$ about an axis $n_j$:

$$\Phi_j = -\gamma\Delta t\sqrt{|B_{1,j}|^2 + (G\cdot r + \Delta B_0)^2} \quad (3b)$$

$$n_j = \frac{\gamma\Delta t}{\Phi_j}(B_{1,j}x, B_{1,j}y, G\cdot r + \Delta B_0) \quad (3c)$$

(in equation (3c), $B_{1,j}x$ and $B_{1,j}y$ are the components of $B_{1,j}$ along the axis x and y, $B_{1,j}z$ being supposed to be zero). Explicit expressions for $\alpha$ and $\beta$ are straightforwardly obtained by combining equations (2), (3b) and (3c).

When an array of m transmit coils is used, the total effective $B_1$ field is a function of both space and time. $S^R$ and $S^I$ are the real and imaginary parts of the transmit sensitivities, while $u_k$ and $v_k$ are the control parameters, which represent real and imaginary parts of the RF shape of the $k^{th}$ transmitter:

$$B_1(r, t) = \sum_{k=1}^{m} [S_k^R(r) + iS_k^I(r)][u_k(t) + iv_k(t)] \quad (4)$$

The problem to be solved consists in determining the control parameters $u_k$ and $v_k$ (and, optionally, the gradients G) to approximate as closely as possible a target transformation.

In the case of refocusing, the target is a rotation matrix of a given angle $\theta$, with a purely transverse axis, whose in-plane direction ("phase") is left free. Once a proper target is established, a metric to optimize its distance with the candidate pulse needs to be found. For a general value of $\theta$, two "virtual" target rotation matrices decomposing the desired operation can be used:

$$U_{F1} = \begin{bmatrix} \cos\frac{\theta}{2} & 0 \\ 0 & \cos\frac{\theta}{2} \end{bmatrix} \quad (5a)$$

and $$U_{F2} = \begin{bmatrix} 0 & 2\sin\frac{\theta}{2} \\ 0 & 0 \end{bmatrix} \quad (5b)$$

To tailor the RF pulse rotation matrix in the $n^{th}$ voxel, the proposed performance criterion $\varphi_n$ (which can be called "phase-free performance criterion", as the phase of the rotation is left free) is:

$$\varphi_n = \varphi_{1,n} + \varphi_{2,n} = |\langle U_{F1} | U_n(T)\rangle/2| + |\langle U_{F2} | U_n(T)\rangle/2| \quad (6)$$

Indeed, rewriting this expression knowing that $\langle U_{F1}|U_n(T)\rangle = \text{Tr}(U_{F1}^\dagger U_n(T))$ gives:

$$\varphi_n = \left|\cos\frac{\theta}{2}\cos\frac{\Phi}{2}\right| + \sqrt{n_x^2+n_y^2}\left|\sin\frac{\theta}{2}\sin\frac{\Phi}{2}\right|. \quad (7)$$

Evaluation of $\varphi_n$ shows that this criterion is equal to one, its maximum value, if and only if:

$$\begin{cases} \Phi = \theta \\ \sqrt{n_x^2+n_y^2} = 1 \end{cases} \quad (8)$$

or $$\begin{cases} \Phi = 2k\pi - \theta \\ \sqrt{n_x^2+n_y^2} = 1 \end{cases}$$

where k is an integer.

In practice, the second case is not encountered, as the required energy would be considerably higher for the same pulse duration. After summing this performance criterion for all voxels $$\left(\varphi = \frac{1}{N}\sum_{n=1}^{N}\varphi_n\right),$$

a cost function equal to $1-\varphi$ is minimal, if and only if the rotation angle is $\delta$ and the rotation axis is purely transverse everywhere in the ROI. It is important to note that $U_{F1}$ and $U_{F2}$ do not correspond to physical rotation matrices, as they are not unitary. Their use is simply a mathematical convenience that removes the phase constraint on the transverse rotation axis. After time discretization, the derivatives of this performance function with respect to all control parameters $u_k, v_k$ (which are the real and imaginary parts of the RF pulse on each coil channel) are taken to compute its gradient, knowing that for each voxel:

$$\frac{\partial \varphi_{1,2}}{\partial u_k} = \frac{1}{2}\frac{1}{\varphi_{1,2}}\frac{\partial \varphi_{1,2}^2}{\partial u_k} \quad (9a)$$

$$\frac{\partial \varphi_{1,2}}{\partial v_k} = \frac{1}{2}\frac{1}{\varphi_{1,2}}\frac{\partial \varphi_{1,2}^2}{\partial v_k} \quad (9b)$$

In this way, the original analytical formulation of the derivative proper to the GRAPE algorithm could be retrieved, acknowledging the fact that this function is not strictly speaking differentiable at $\varphi_{1,2}=0$ (see references [18-19] for the whole expression of the derivative with 2×2 rotations matrices). Control parameters are then updated using the conjugate gradient method. As in [18], gradient blips intensities can also be considered as additional degrees of freedom and optimized with the RF in order to modulate the k-space trajectory.

In the case of the SPACE sequence, the formalism described above is used to tailor a reference refocusing pulse of the RF echo train. This pulse then dictates a phase pattern (i.e. a spatial distribution of the orientation of the rotation axis in the transverse plane) for the whole sequence. For all subsequent refocusing pulses, as well as the initial excitation pulse, care has to be taken as the CPMG condition fulfillment is important to obtain the desired refocusing of magnetization. Indeed, as several types of echoes (primary echo, stimulated echo, etc.) arise from multiple refocusing pathways, it is required that simultaneously acquired echoes are kept phase-coherent. This can be obtained by targeting a specific phase pattern, precisely the one of the reference refocusing pulse, and change only the rotation angle. Hence, the target rotation matrix is:

$$U_F = \begin{bmatrix} \alpha_T & -\beta_T^* \\ \beta_T & \alpha_T^* \end{bmatrix}, \quad (11)$$

with:

$$\begin{cases} \alpha_T = \cos\frac{\theta}{2} \\ \beta_T = -i(n_{xT}+in_{yT})\sin\frac{\theta}{2} \end{cases}$$

where $\theta$ is the new desired target rotation angle, $n_{xT}$ and $n_{yT}$ the normalized components of the first refocusing pulse axis of rotation (voxel-dependent). The "phase-constrained" performance criterion, called is then:

$$\varphi = \frac{1}{N}\sum_{n=1}^{N}\varphi_n = \frac{1}{N}\sum_{n=1}^{N}|\langle U_F | U_n(T)\rangle|^2. \quad (12)$$

The optimization procedure and the updating of the control parameters then is the same as above, the only difference being smaller latitude in the optimization, as the target operator is more specific. Last, thanks to the smooth variation of the angle values along the RF train, a previously designed pulse can be used as an initial guess for the next one, thus greatly speeding up the algorithm convergence.

A flowchart of the whole procedure in order to tailor every single RF pulse of a SPACE-like sequence, and more precisely a SPACE/FLAIR sequence, is provided in FIG. 1.

Step 1: The initial guess waveform IGP is the solution returned by the small tip angle approximation, using the $k_T$-points method [12]. It is a composite pulse comprising e.g. three rectangular sub-pulses and gradient blips (not represented).

Step 2: The reference refocusing pulse RRP is designed with a phase-free rotation axis. The reference pulse is not necessarily the first pulse of the train; more advantageously, it is chosen such that the corresponding rotation angle has an intermediate value (it is neither the largest nor the smallest rotation angle, and preferably is approximately halfway between them). It can be seen on the figure that the reference refocusing pulse is a composite pulse comprising the same number of sub-pulses than the initial guess waveform; but now the sub-pulses are shaped. Again, gradient blips are not represented.

Step 3: The phase pattern PHP of the rotation axis is stored and used as a target for the design of all subsequent refocusing pulses (step 4).

Step 4: The other refocusing pulses of the refocusing pulse train RPT are designed, with the phase pattern determined at step 3. Pulses are designed one by one, taking an adjacent, already designed pulse as an initial guess. For the sake of simplicity, pulses are represented as rectangular waveforms, even if in reality they are composite and, after optimization, shaped.

Step 5: The excitation pulse EXP is designed in a similar way, targeting 90° and the same phase pattern dephased by +π/2 to fulfill CPMG condition.

Step 6: The GRAPE algorithm is used to design an additional inversion pulse IP if needed (e.g. for suppressing the signal coming from the Cerebrospinal fluid, according to a method known as "FLAIR").

Experimental validation was performed on a 7 Tesla Magnetom scanner (Siemens, Erlangen, Germany), equipped with parallel transmission capabilities and an AC84 head gradient system allowing amplitudes up to of 50 mT/m and a slew rate of 333 T/m/s, on four different healthy volunteers. The study was approved by the applicant's review board and informed consent was obtained from all volunteers. For both RF transmission and reception, a home-made transceiver-array head coil was used [21]. The array consists of 8 stripline dipoles distributed every 42.5° on a cylindrical surface of 27.6-cm diameter, leaving a small open space in front of the subject's eyes.

The variable flip angle series of the SPACE sequence that yields prescribed signal evolution was calculated for specified $T_1=1400$ ms and $T_2=40$ ms relaxation times (min. angle: 10°, max angle: 100°). Conventional square pulse durations were set to 600 μs and 900 μs for the CP-mode and RF-shimming respectively. An initial candidate waveform fed to the GRAPE algorithm (i.e. the inventive method) consisted of solving the Magnitude Least Squares problem [22] with a 3 $k_T$-point self-refocused trajectory (i.e. k(0)=0) surrounding the center of k-space. The location of the $k_T$-points was determined empirically off-line for an initial case study [12] and was kept the same for all the subjects, keeping in mind that these locations were then free to move thanks to the GRAPE algorithm. The reference refocusing pulse design was achieved after about 100 iterations of the first adaptation of the GRAPE algorithm presented in the theory section. For the other pulses, a quasi-linear scaling of their duration with respect to the prescribed angle was followed by 2 to 10 iterations of the GRAPE algorithm presented above. With this setup, about 50 different pulses needed to be designed, since several similar pulses are used in the echo train. The peak amplitudes of the designed waveforms were constrained to the maximum voltage available per channel (180 V). Replacing the original hard pulses of the SPACE sequence with sets of sub-pulses and gradients blips inevitably increases their durations and Specific Absorption Rate (SAR) contributions. This inherently affects the TR of the sequence, the echo spacing ES and the shape of the RF echo train. The following sequence protocol was implemented: TR: 6 s, ES: 9 ms, effective TE: 315 ms, Echo Train Length: 96 pulses, resolution: 1 mm isotropic, matrix size: 256×224×160, GRAPPA factor: 2, Partial Fourier: 6/8, TA: 12 min.

Figure 2A:
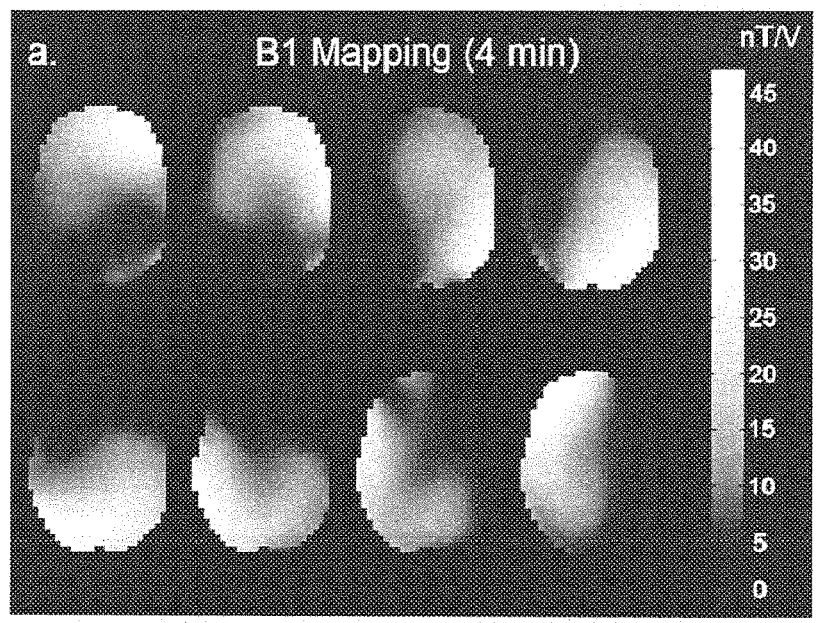
FIGS. 2A-2E, the implementation of a method according to another particular embodiment of the invention.
Figure 2B:
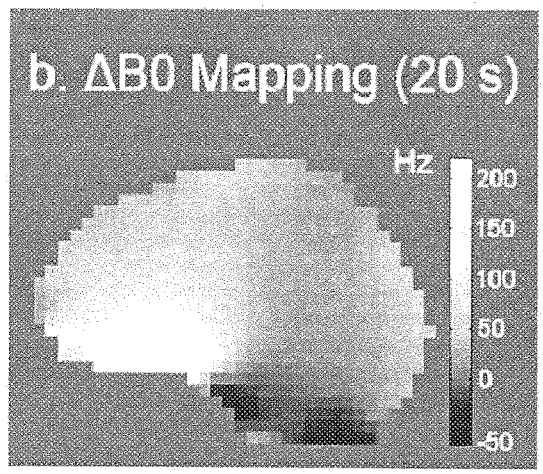
Figure 2C:
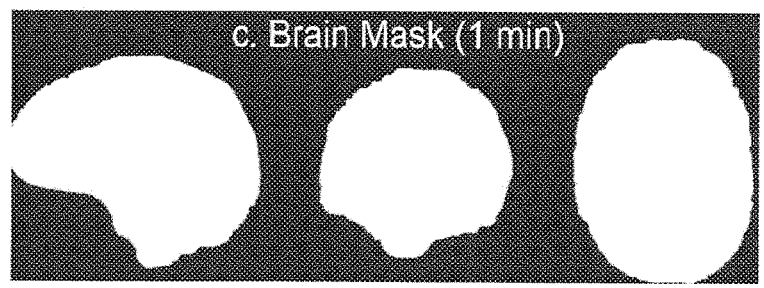
Figure 2D:
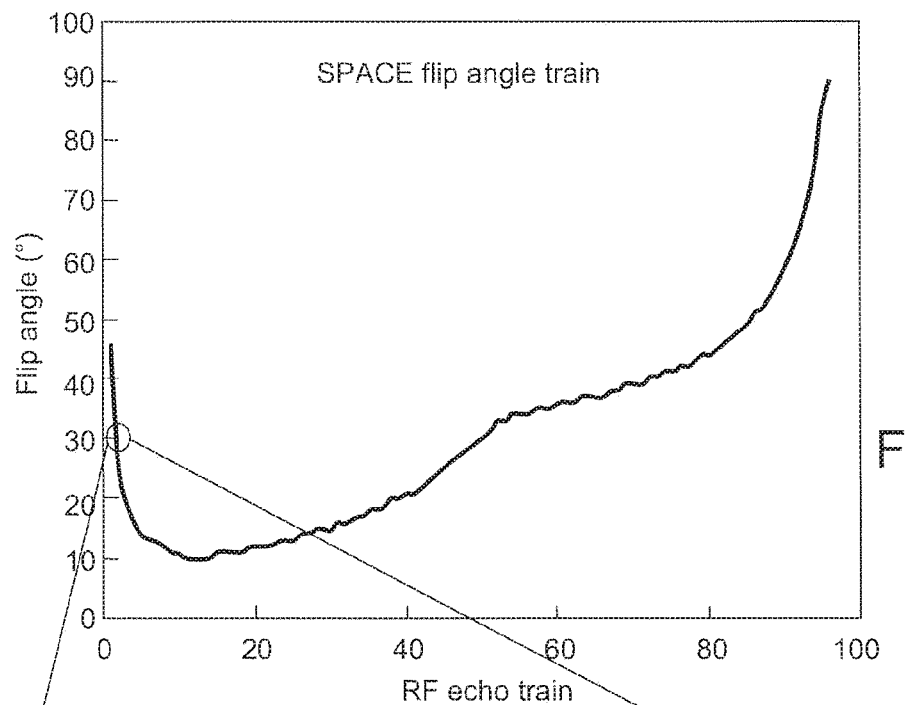
Figure 2E:
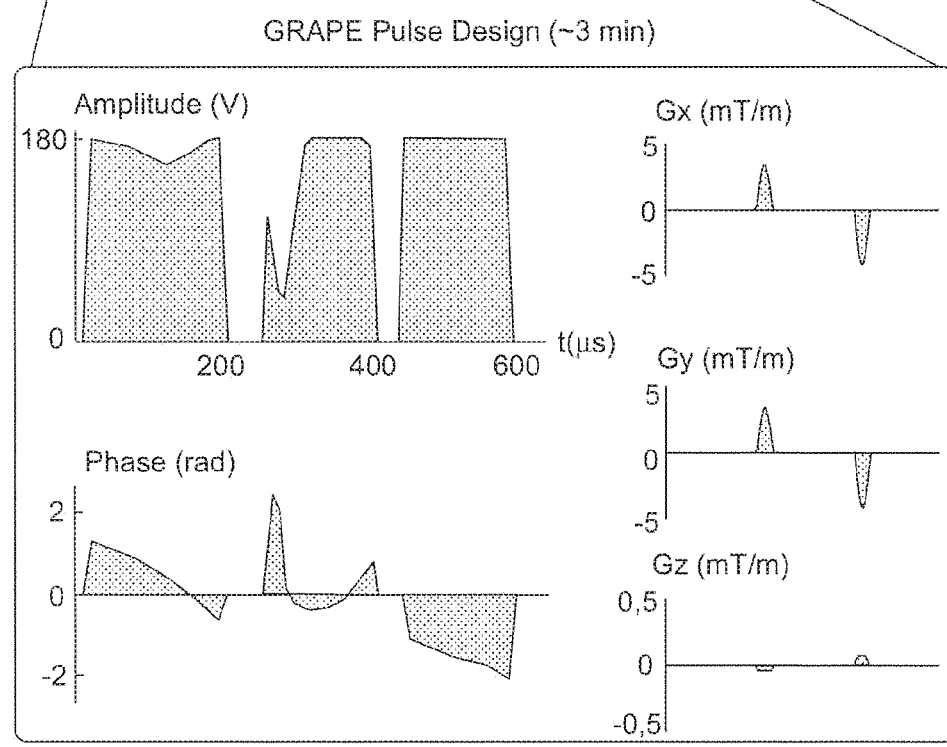

FIG. 2A shows the measured transmit sensitivity magnitudes of the eight transmit elements (central axial slices). FIG. 2B is a $\Delta B_0$ map measured in Hz, central sagittal slice. FIG. 2C defines the region of interest, extracted with conventional brain volume extraction software (central slices). FIG. 2D illustrates the flip-angle train designed for the SPACE sequence used in the present study. FIG. 2E shows an example of a tailored RF pulse on one of the Tx-channels (amplitude, phase and gradient blips).

Figure 3:
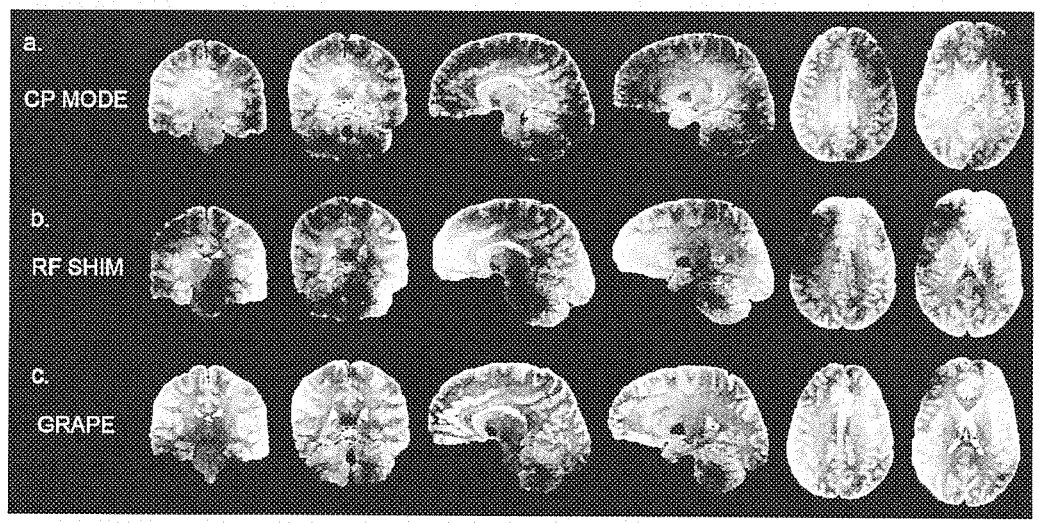
FIG. 3, $T_2$-weighted MRI images obtained using prior art techniques and a method according to the embodiment of the invention whose implementation is illustrated on FIGS. 2A-2E.

$T_2$-weighted SPACE images for three configurations (CP-mode, RF-shim configuration and GRAPE design) are displayed on FIG. 3 for one of the subjects.

The first line of the figure, labeled "a", corresponds to a conventional CP-mode method with hard pulses, implemented at 7 Tesla resulting in strong signal voids in the cerebellum and in temporal lobes.

The second line of the figure, labeled "b", corresponds to the application of a subject-specific static RF-shim with hard pulses. Image quality is improved to some extent, thus allowing cerebellar GM/WM to be distinguished. Even so, residual $B_1^+$ non-uniformities introduce significant signal variations in other regions of the brain, complicating distinction between GM and WM in these regions with confidence.

The third line of the figure, labeled "c", corresponds to a method according to an embodiment of the invention, using GRAPE-tailored $k_T$-points. Use of this method improves every refocusing profile and leads to higher signal homogeneity for a given tissue across the brain. Considerable improvements occur in the cerebellum, in the upper brain region and in the temporal lobes. In addition, intricate structures of the cortex can now be resolved in greater detail. This improvement comes at the cost of less than 10 preliminary minutes of subject-specific data acquisition and pulse design (4 minutes for $B_1$ mapping, 20 sec. for $\Delta B_0$ mapping, 1 min. for brain masking and about three minutes for GRAPE pulse design—times are indicated on FIGS. 2A-2E).

Figure 4:
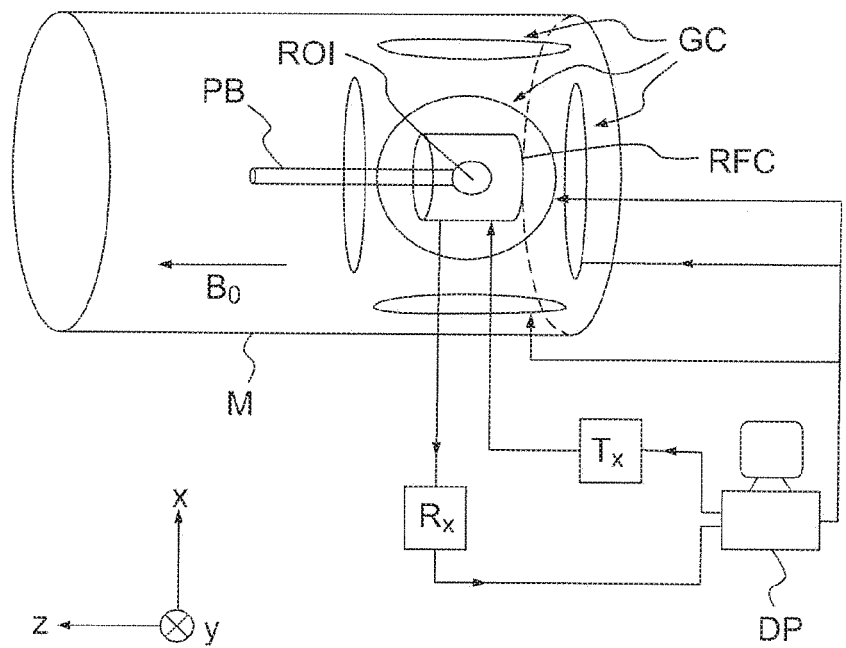
FIG. 4, a MRI apparatus (scanner) suitable for carrying out a method according to the invention.

FIG. 4 represents—very schematically—a Magnetic Resonance Imaging (MRI) scanner comprising:

a magnet M for generating magnetization field $B_0$, which is a static and substantially uniform magnetic field oriented along direction z ("longitudinal"), in which is immersed a patient body (or a part of it) PB to be imaged;

a radio-frequency coil RFC for exposing said body to transverse radio-frequency pulses (as discussed above, "transverse" here means having a polarization which is perpendicular to $B_0$, and therefore lying in a x-y plane) and for detecting signal emitted by flipped nuclear spins within said body; in parallel transmission, there are as many radio-frequency coils as there are transmit and/or receive channels;

three sets of gradient coils GC for generating gradient fields, i.e. magnetic fields directed along the z direction which vary linearly along a respective spatial direction across the region of interest (ROI);

a transmitter Tx for generating radio-frequency pulses, which feed the radio-frequency coil (in parallel transmission, there are as many transmitters as there are transmit channels);

a receiver R for amplifying said spin resonance signal before demodulating and digitizing it (in parallel imaging, the receivers are duplicated as many times as there are receive channels) and a data processor DP driving the transmitter(s) and the gradient coils, and processing the signal received by the receiver(s).

The data processor DP can be a computer—or a set of electronic programmable computers—comprising at least a memory for storing a computer program (i.e. a piece of executable code) and a least one processor for executing said program. The hardware part of the scanner can be conventional, while the software is adapted for carrying out the method of the invention. Therefore software means—e.g. code stored on a computer-readable storage medium such as a CD-ROM—can turn a standard scanner into a device according to the invention, without any need for hardware modifications.

The invention can be applied to any MRI sequence based on the use of a refocusing pulse (rotating nuclear spins by a fixed angle, different from 180°), or a train of interacting refocusing pulse pulses (e.g. the SPACE method, discussed above). This sequence can be either 3D (e.g. SPACE) or 2D. The sequence can be $T_2$- or $T_1$-weighted, or used a mixed weighting ($T_2$-weighted SPACE has been discussed, but $T_1$-weighting is also possible).

REFERENCES

[1] de Graaf W L, Zwanenburg J J, Visser F, Wattjes M P, Pouwels P J, Geurts J J, Polman C H, Barkhof F, Luijten P R, Castelijns J A. Lesion detection at seven Tesla in multiple sclerosis using magnetization prepared 3D-FLAIR and 3D-DIR. Eur Radiol 2012; 22:221-231.
[2] van der Kolk A G, Zwanenburg J J, Brundel M, Biessels G J, Visser F, Luijten P R, Hendrikse J. Intracranial vessel wall imaging at 7.0-T MRI. Stroke 2011; 42:2478-2484.
[3] Hennig J, Nauerth A, Friedburg H. RARE imaging: a fast imaging method for clinical M R. Magn Reson Med 1986; 3:823-833.
[4] Hennig J, Scheffler K. Hyperechoes. Magn Reson Med 2001; 46:6-12.
[5] Busse R F, Hariharan H, Vu A, Brittain J H. Fast Spin Echo sequences with very long echo trains: Design of variable refocusing flip angle schedules and generation of clinical T2 contrast. Magn Reson Med 2006; 55:1030-1037.
[6] Mugler J P. Three-dimensional T2-weighted imaging of the brain using very long spin-echo trains. In Proceedings of the 8th Annual Meeting of ISMRM, Denver, Colo., USA, 2000. p. 687.
[7] Visser F, Zwanenburg J J, Hoogduin J M, Luijten P R. High-resolution magnetization-prepared 3D-FLAIR imaging at 7.0 Tesla. Magn Reson Med 2010; 64:194-202.
[8] U. Katscher, P. Bornert, C. Leussler, J. S. Van Den Brink, Transmit SENSE, Magn. Reson. Med. 49 (2003) 144-150.
[9] Y. Zhu, Parallel excitation with an array of transmit coils, Magn. Reson. Med. 51 (2004) 775-784.
[10] P. F. Van de Moortele, C. Akgun, G. Adriany, S. Moeller, J. Ritter, C. M. Collins, M. B. Smith, T. Vaughan, K. Ugurbil, B1 destructive interferences and spatialphase patterns at 7 T with a head transceiver array coil, Magn. Reson. Med. 54 (2005) 1503-1518.
[11] Malik S J, Padormo F, Price A N, Hajnal J V. Spatially resolved extended phase graphs: modeling and design of multipulse sequences with parallel transmission. Magn Reson Med 2012; 68:1481-1494.
[12] M. A. Cloos, N. Boulant, M. Luong, G. Ferrand, E. Giacomini, D. Le Bihan, A. Amadon, kT-Points: short three-dimensional tailored RF pulses for flip-angle homogenization over an extended volume, Magn. Reson. Med. 67 (2012) 72-80.
[13] D. Xu, K. F. King, Y. Zhu, G. C. McKinnon, Z. P. Liang, Designing multichannel multidimensional, arbitrary flip angle RF pulses using an optimal control approach, Magn. Reson. Med. 59 (2008) 547-560.
[14] M. A. Cloos, N. Boulant, M. Luong, G. Ferrand, E. Giacomini, M.-F. Hang, C. J. Wiggins, D. Le Bihan, A. Amadon, Parallel-transmission-enabled magnetization-prepared rapid gradient-echo T1-weighted imaging of the human brain at 7 T, Neuroimage 62 (2012) 2140-2150.
[15] J. Pauly, D. Nishimura, A. Macovski, A linear class of large-tip-angle selective excitation pulses, J. Magn. Reson. 82 (1989) 571-587.
[16] Setsompop K, Alagappan V, Zelinski A C, Potthast A, Fontius U, Hebrank F, Schmitt F, Wald L L, Adalsteinsson E. High-flip-angle slice-selective parallel RF transmission with 8 channels at 7 T. J Magn Reson 2008; 195:76-84.
[17] Eggenschwiler F, O'Brien K R, Gruetter R, Marques J P. Improving T2-weighted imaging at High Field through the use of kT-points. Magn Reson Med 2014. doi: 10.1002/mrm.24805.
[18] Khaneja N, Reiss T, Kehlet C, Schulte-Herbrüggen T, Glaser S J. Optimal control of coupled spin dynamics: design of NMR pulse sequences by gradient ascent algorithms. J Magn Reson 2005; 172: 296-305.
[19] Massire A, Cloos M A, Vignaud A, Le Bihan D, Amadon A, Boulant N. Design of non-selective refocusing pulses with phase-free rotation axis by gradient ascent pulse engineering algorithm in parallel transmission at 7 T. J Magn Reson 2013; 230:76-83.
[20] Pauly J, Le Roux P, Nishimura D, Macovski A. Parameter relations for the Shinnar-Le Roux selective excitation pulse design algorithm. IEEE Trans. Med. Imaging 1991; 10:53-64.
[21] Ferrand G, Luong M, France A. Résonateur Linéaire d'une Antenne Haute Fréquence pour Appareil d'Imagerie par Résonance Magnétique Nucléaire, WO/2011/098713, PCT/FR2011/098713.
[22] Setsompop K, Wald L L, Alagappan V, Gagoski B A, Adalsteinsson E. Magnitude least squares optimization for parallel radio frequency excitation design demonstrated at 7 T with eight channels. Magn Reson Med 2008; 59:908-915.

The invention claimed is:
1. A method of designing a refocusing pulse for Magnetic Resonance Imaging, said pulse being suitable to induce a rotation of nuclear spins around a rotation axis lying in a plane perpendicular to a magnetization field $B_0$, called a transverse plane, with an arbitrary orientation, the method comprising adjusting a plurality of control parameters of said pulse to maximize a performance criterion φ, called phase-free performance criterion, given by:

$$\varphi \propto \sum_{n=1}^{N} \varphi_n$$

N≥1 being the number of voxels, with:

$$\varphi_n \propto \varphi_{1,n} + \varphi_{2,n}$$

wherein:

$$\varphi_{1,n} = \left| \frac{\langle U_{F1} | U_n(T) \rangle}{2} \right|, \text{ and } \varphi_{2,n} = \left| \frac{\langle U_{F2} | U_n(T) \rangle}{2} \right|;$$

$$U_{F1} = \begin{bmatrix} \cos\frac{\theta}{2} & 0 \\ 0 & \cos\frac{\theta}{2} \end{bmatrix}$$

and $$U_{F2} = \begin{bmatrix} 0 & 2\sin\frac{\theta}{2} \\ 0 & 0 \end{bmatrix}$$

are two target operators in spin-domain representation;
θ is a target value of the rotation angle of said nuclear spins induced by said pulse, said angle θ being different from Mπ radians, with integer M;

$U_n(T)$ is a rotation matrix expressing, also in spin-domain representation, the action of said pulse, of duration T, on nuclear spins of the $n^{th}$ voxel; and said method being carried out by a computer.

2. The method according to claim 1, wherein $$U_n(T) = \begin{bmatrix} \alpha & -\beta^* \\ \beta & \alpha^* \end{bmatrix}$$

is a solution of the spin-domain Bloch equation:

$$\begin{bmatrix} \dot{\alpha} \\ \dot{\beta} \end{bmatrix} = \frac{i\gamma}{2} \begin{bmatrix} G \cdot r + \Delta B_0 & B_1^* \\ B_1 & -(G \cdot r + \Delta B_0) \end{bmatrix} \begin{bmatrix} \alpha \\ \beta \end{bmatrix}$$

where:
i is the imaginary unit;
$\gamma$ is a nuclear spin gyromagnetic ratio
G is a magnetic field gradient;
r is a position vector of the n-th voxel;
$\Delta B_0$ expresses the non-uniformity of the magnetization field $B_0$; and
$B_1$ expresses the spatial distribution of the pulse.

3. A method of designing a refocusing pulse train for Magnetic Resonance Imaging, said pulse train comprising a plurality of refocusing pulses, each of said refocusing pulses being adapted for inducing a rotation of nuclear spins of a respective angle $\theta_i$, said method comprising the steps of:

A. using a computer for designing one said refocusing pulse, called reference pulse, by adjusting a plurality of control parameters of said pulse to maximize a performance criterion $\varphi$, called phase-free performance criterion, given by:

$$\varphi \propto \sum_{n=1}^{N} \varphi_n$$

$N \geq 1$ being the number of voxels, with:

$\varphi_n \propto \varphi_{1,n} + \varphi_{2,n}$ wherein:

$$\varphi_{1,n} = \left| \frac{\langle U_{F1} | U_n(T) \rangle}{2} \right|, \text{ and } \varphi_{2,n} = \left| \frac{\langle U_{F2} | U_n(T) \rangle}{2} \right|;$$

$$U_{F1} = \begin{bmatrix} \cos\frac{\theta}{2} & 0 \\ 0 & \cos\frac{\theta}{2} \end{bmatrix}$$

and $$U_{F2} = \begin{bmatrix} 0 & 2\sin\frac{\theta}{2} \\ 0 & 0 \end{bmatrix}$$

are two target operators in spin-domain representation;
$\theta$ is a target value of the rotation angle of said nuclear spins induced by said pulse, said angle $\theta$ being different from $M\pi$ radians, with integer M; and $U_n(T)$ is a rotation matrix expressing, also in spin-domain representation, the action of said pulse, of duration T, on nuclear spins of the $n^{th}$ voxel;

B. for one or more voxels of said imaging region of interest, determining a voxel-dependent nuclear spin rotation axis, expressed by vector $n_T = (n_{xT}, n_{yT}, n_{zT} = 0)$ in a Cartesian frame having a z-axis parallel to said magnetization field $B_0$, corresponding to said reference pulse; and C. for each of said refocusing pulses, other than said reference pulse, adjusting a plurality of control parameters of said pulse to maximize a performance criterion, called phase-constrained performance criterion, representative of a proximity between a rotation of nuclear spins induced by said pulse and a target operator, said phase-constrained performance criterion being summed or averaged over said voxels of an imaging region of interest;

wherein, for each of said refocusing pulses other than said reference pulse, identified by an index i, said target operator is chosen such that said phase-constrained performance criterion takes a maximum value when the nuclear spins within each of said voxels undergo a rotation of a same angle $\theta_i$ around a respective nuclear spin rotation axis $n_T$ determined at step B.

4. The method according to claim 3, wherein:
said phase-constrained performance criterion is given by $$\varphi \propto \sum_{n=1}^{N} \varphi_n, N \geq 1$$

being the number of voxels, with: $\varphi_n \propto |\langle U_F | U_n(T) \rangle|^2$ where:

$$U_F = \begin{bmatrix} \alpha_T & -\beta_T^* \\ \beta_T & \alpha_T^* \end{bmatrix},$$

with:

$$\begin{cases} \alpha_T = \cos\frac{\theta_i}{2} \\ \beta_T = i(n_{xT} + in_{yT})\sin\frac{\theta_i}{2} \end{cases}$$

is the target operator for each voxel and $U_n(T)$ is a rotation matrix expressing, also in spin-domain representation, the action of said pulse or pulse sequence on nuclear spins of the $n^{th}$ voxel.

5. The method according to claim 4, wherein $$U_n(T) = \begin{bmatrix} \alpha & -\beta^* \\ \beta & \alpha^* \end{bmatrix}$$

is a solution of the spin-domain Bloch equation:

$$\begin{bmatrix} \dot{\alpha} \\ \dot{\beta} \end{bmatrix} = \frac{i\gamma}{2} \begin{bmatrix} G \cdot r + \Delta B_0 & B_1^* \\ B_1 & -(G \cdot r + \Delta B_0) \end{bmatrix} \begin{bmatrix} \alpha \\ \beta \end{bmatrix}$$

wherein:
i is the imaginary unit;
$\gamma$ is a nuclear spin gyromagnetic ratio
G is a magnetic field gradient;

r is a position vector of the n-th voxel;

$\Delta B_0$ expresses the non-uniformity of the magnetization field $B_0$; and $B_1$ expresses the spatial distribution of the pulse.

6. The method according to claim 3, wherein when carried out step C., said parameters are adjusted iteratively by taking, as initial values, those of corresponding parameters of an adjacent pulse within the pulse train for which said performance criterion has previously been maximized.

7. A method of designing a Magnetic Resonance Imaging pulse sequence comprising:

i. designing a refocusing pulse train by:

A. using a computer for designing one said refocusing pulse, called reference pulse, by adjusting a plurality of control parameters of said pulse to maximize a performance criterion $\varphi$, called phase-free performance criterion, given by:

$$\varphi \propto \sum_{n=1}^{N} \varphi_n$$

N≥1 being the number of voxels, with:

$\varphi_n \propto \varphi_{1,n} + \varphi_{2,n}$ wherein:

$$\varphi_{1,n} = \left| \frac{\langle U_{F1} | U_n(T) \rangle}{2} \right|, \text{ and } \varphi_{2,n} = \left| \frac{\langle U_{F2} | U_n(T) \rangle}{2} \right|;$$

$$U_{F1} = \begin{bmatrix} \cos\frac{\theta}{2} & 0 \\ 0 & \cos\frac{\theta}{2} \end{bmatrix}$$

and $$U_{F2} = \begin{bmatrix} 0 & 2\sin\frac{\theta}{2} \\ 0 & 0 \end{bmatrix}$$

are two target operators in spin-domain representation;

$\theta$ is a target value of the rotation angle of said nuclear spins induced by said pulse, said angle $\theta$ being different from $M\pi$ radians, with integer M; and $U_n(T)$ is a rotation matrix expressing, also in spin-domain representation, the action of said pulse, of duration T, on nuclear spins of the $n^{th}$ voxel;

B. for one or more voxels of said imaging region of interest, determining a voxel-dependent nuclear spin rotation axis, expressed by vector $n_T=(n_{xT}, n_{yT}, n_{zT}=0)$ in a Cartesian frame having a z-axis parallel to said magnetization field $B_0$, corresponding to said reference pulse;

C. for each of said refocusing pulses, other than said reference pulse, adjusting a plurality of control parameters of said pulse to maximize a performance criterion, called phase-constrained performance criterion, representative of a proximity between a rotation of nuclear spins induced by said pulse and a target operator, said phase-constrained performance criterion being summed or averaged over said voxels of an imaging region of interest;

wherein, for each of said refocusing pulses other than said reference pulse, identified by an index i, said target operator is chosen such that said phase-constrained performance criterion takes a maximum value when the nuclear spins within each of said voxels undergo a rotation of a same angle $\theta_i$ around a respective nuclear spin rotation axis $n_T$ determined at step B; and ii. designing a nuclear spin excitation pulse, to be generated before said refocusing pulse or pulse train, by adjusting a plurality of control parameters of said pulse to maximize a performance criterion, called phase-constrained performance criterion, representative of a proximity between a rotation of nuclear spins induced by said excitation pulse and a target operator, said phase-constrained performance criterion being summed or averaged over said voxels of an imaging region of interest;

wherein said target operator is chosen such that said phase-constrained performance criterion takes a maximum value when the nuclear spins within each of said voxels undergo a rotation of a same flipping angle FA around a respective nuclear spin rotation axis lying in said transverse plain and orthogonal to the nuclear spin rotation axis corresponding to said refocusing pulse train.

8. The method of designing a Magnetic Resonance Imaging pulse sequence according to claim 7, further comprising:

iii. designing a nuclear spin inversion pulse, to be generated before said nuclear spin excitation pulse, by adjusting a plurality of control parameters of said pulse to maximize a phase-free performance criterion, representative of a proximity between a rotation of nuclear spins induced by said nuclear spin inversion pulse and a target operator, said operator being summed or averaged over one or more voxels of an imaging region of interest; and iv. wherein said target operator is chosen such that said phase-free performance criterion takes a maximum value when the nuclear spins within all said voxels undergo a rotation of a same angle of $\pi$ radians around a rotation axis lying in said transverse plane, with an arbitrary orientation.

9. The method according to claim 1, wherein said step of adjusting a plurality of control parameters of said or each said pulse to maximize a said performance criterion is performed using a gradient ascent algorithm with analytically-computed gradients.

10. The method according to claim 1, wherein at least some of said control parameters represent samples of a complex envelope of said or one said pulse.

11. A method of generating a Magnetic Resonance Imaging pulse, pulse train, or pulse sequence comprising:

a step of designing said pulse, pulse train, or pulse sequence by using a computer for designing one said refocusing pulse, called reference pulse, by adjusting a plurality of control parameters of said pulse to maximize a performance criterion $\varphi$, called phase-free performance criterion, given by:

$$\varphi \propto \sum_{n=1}^{N} \varphi_n$$

N≥1 being the number of voxels, with:

$\varphi_n \propto \varphi_{1,n} + \varphi_{2,n}$ wherein:

$$\varphi_{1,n} = \left|\frac{\langle U_{F1} | U_n(T)\rangle}{2}\right|, \text{ and } \varphi_{2,n} = \left|\frac{\langle U_{F2} | U_n(T)\rangle}{2}\right|;$$

$$U_{F1} = \begin{bmatrix} \cos\frac{\theta}{2} & 0 \\ 0 & \cos\frac{\theta}{2} \end{bmatrix}$$

and $$U_{F2} = \begin{bmatrix} 0 & 2\sin\frac{\theta}{2} \\ 0 & 0 \end{bmatrix}$$

are two target operators in spin-domain representation;
θ is a target value of the rotation angle of said nuclear spins induced by said pulse, said angle θ being different from Mπ radians, with integer M; and
$U_n(T)$ is a rotation matrix expressing, also in spin-domain representation, the action of said pulse, of duration T, on nuclear spins of the $n^{th}$ voxel; and
a step of actually generating said pulse, pulse train, or pulse sequence.

12. A method of performing Magnetic Resonance Imaging comprising a step of generating a pulse, pulse train or pulse sequence using:
a step of designing said pulse, pulse train, or pulse sequence by using a computer for designing one said refocusing pulse, called reference pulse, by adjusting a plurality of control parameters of said pulse to maximize a performance criterion φ, called phase-free performance criterion, given by:

$$\varphi \propto \sum_{n=1}^{N} \varphi_n$$

N≥1 being the number of voxels, with:

$$\varphi_n \propto \varphi_{1,n} + \varphi_{2,n}$$

wherein:

$$\varphi_{1,n} = \left|\frac{\langle U_{F1} | U_n(T)\rangle}{2}\right|, \text{ and } \varphi_{2,n} = \left|\frac{\langle U_{F2} | U_n(T)\rangle}{2}\right|;$$

$$U_{F1} = \begin{bmatrix} \cos\frac{\theta}{2} & 0 \\ 0 & \cos\frac{\theta}{2} \end{bmatrix}$$

and $$U_{F2} = \begin{bmatrix} 0 & 2\sin\frac{\theta}{2} \\ 0 & 0 \end{bmatrix}$$

are two target operators in spin-domain representation;
θ is a target value of the rotation angle of said nuclear spins induced by said pulse, said angle θ being different from Mπ radians, with integer M; and
$U_n(T)$ is a rotation matrix expressing, also in spin-domain representation, the action of said pulse, of duration T, on nuclear spins of the $n^{th}$ voxel; and
a step of actually generating said pulse, pulse train, or pulse sequence.

13. A non-transitory computer readable medium comprising instructions that, when executed on a computer, cause the computer to automatically perform a method of designing a refocusing pulse for Magnetic Resonance Imaging, said pulse being suitable to induce a rotation of nuclear spins around a rotation axis lying in a plane perpendicular to a magnetization field $B_0$, called a transverse plane, with an arbitrary orientation, the method comprising adjusting a plurality of control parameters of said pulse to maximize a performance criterion φ, called phase-free performance criterion, given by:

$$\varphi \propto \sum_{n=1}^{N} \varphi_n$$

N≥1 being the number of voxels, with:

$$\varphi_n \propto \varphi_{1,n} + \varphi_{2,n}$$

wherein:

$$\varphi_{1,n} = \left|\frac{\langle U_{F1} | U_n(T)\rangle}{2}\right|, \text{ and } \varphi_{2,n} = \left|\frac{\langle U_{F2} | U_n(T)\rangle}{2}\right|;$$

$$U_{F1} = \begin{bmatrix} \cos\frac{\theta}{2} & 0 \\ 0 & \cos\frac{\theta}{2} \end{bmatrix}$$

and $$U_{F2} = \begin{bmatrix} 0 & 2\sin\frac{\theta}{2} \\ 0 & 0 \end{bmatrix}$$

are two target operators in spin-domain representation;
θ is a target value of the rotation angle of said nuclear spins induced by said pulse, said angle θ being different from Mπ radians, with integer M; and
$U_n(T)$ is a rotation matrix expressing, also in spin-domain representation, the action of said pulse, of duration T, on nuclear spins of the $n^{th}$ voxel.

14. A Magnetic Resonance Imaging apparatus comprising:
at least a magnet for generating a magnetization field;
a set of gradient coils for generating magnetic field gradients;
at least one radio-frequency coil for transmitting and receiving radio-frequency pulses;
at least a radio-frequency emitter and a radio-frequency receiver connected to said radio-frequency coil or coils; and
a data processor configured or programmed for designing a Magnetic Resonance Imaging pulse, pulse train, or pulse sequence and for driving at least said radio-frequency emitter or emitters to actually generate said pulse, pulse train, or pulse sequence, wherein
the data processor is configured or programmed for designing said Magnetic Resonance Imaging Pulse, pulse train, or pulse sequence by adjusting a plurality of control parameters of said pulse to maximize a performance criterion φ, called phase-free performance criterion, given by:

$$\varphi \propto \sum_{n=1}^{N} \varphi_n$$

N≥1 being the number of voxels, with:

$\varphi_n \propto \varphi_{1,n} + \varphi_{2,n}$ wherein:

$$\varphi_{1,n} = \left|\frac{\langle U_{F1} | U_n(T) \rangle}{2}\right|, \text{ and } \varphi_{2,n} = \left|\frac{\langle U_{F2} | U_n(T) \rangle}{2}\right|;$$

$$U_{F1} = \begin{bmatrix} \cos\frac{\theta}{2} & 0 \\ 0 & \cos\frac{\theta}{2} \end{bmatrix}$$

and $$U_{F2} = \begin{bmatrix} 0 & 2\sin\frac{\theta}{2} \\ 0 & 0 \end{bmatrix}$$

are two target operators in spin-domain representation;

θ is a target value of the rotation angle of said nuclear spins induced by said pulse, said angle θ being different from Mπ radians, with integer M; and $U_n(T)$ is a rotation matrix expressing, also in spin-domain representation, the action of said pulse, of duration T, on nuclear spins of the $n^{th}$ voxel.

15. The method according to claim 1, wherein θ<π radians.

16. The method according to claim 1, wherein θ<0.9π radians.

17. The method according to claim 3, wherein θ<π radians.

18. The method according to claim 3, wherein θ<0.9π radians.

19. The method according to claim 7, wherein θ<π radians.

20. The method according to claim 7, wherein θ<0.9π radians.

21. The method according to claim 11, wherein θ<π radians.

22. The method according to claim 11, wherein θ<0.9π radians.

23. The non-transitory computer readable medium according to claim 13, wherein θ<π radians.

24. The non-transitory computer readable medium according to claim 13, wherein θ<0.9π radians.

25. The Magnetic Resonance Imaging apparatus according to claim 14, wherein θ<π radians.

26. The Magnetic Resonance Imaging apparatus according to claim 14, wherein θ<0.9π radians.

* * * * *